(12) United States Patent
Imai et al.

(10) Patent No.: US 8,031,893 B2
(45) Date of Patent: Oct. 4, 2011

(54) HEARING AID

(75) Inventors: Junji Imai, Amagasaki (JP); Hitoshi Makinaga, Tsu (JP); Hiroshi Inoue, Mie (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 457 days.

(21) Appl. No.: 12/375,593

(22) PCT Filed: Aug. 10, 2007

(86) PCT No.: PCT/JP2007/065717
§ 371 (c)(1),
(2), (4) Date: Jan. 29, 2009

(87) PCT Pub. No.: WO2008/018586
PCT Pub. Date: Feb. 14, 2008

(65) Prior Publication Data
US 2009/0238390 A1 Sep. 24, 2009

(30) Foreign Application Priority Data

Aug. 11, 2006 (JP) .................................. 2006-220445

(51) Int. Cl.
H04R 25/02 (2006.01)
(52) U.S. Cl. ........................................ 381/323; 381/330
(58) Field of Classification Search .................. 381/323, 381/330
See application file for complete search history.

(56) References Cited

U.S. PATENT DOCUMENTS

| | | | | |
|---|---|---|---|---|
| 2,787,670 A | * | 4/1957 | Rowland | ........................ 381/324 |
| 4,792,886 A | * | 12/1988 | Sahm | ................................ 363/60 |
| 7,327,850 B2 | * | 2/2008 | Crump et al. | .................... 381/74 |
| 2009/0182392 A1 | * | 7/2009 | Woolaston et al. | .............. 607/57 |
| 2010/0211142 A1 | * | 8/2010 | Rogers et al. | .................. 607/113 |

FOREIGN PATENT DOCUMENTS

| | | |
|---|---|---|
| DE | 102005032291 B3 * | 12/2006 |
| EP | 0844805 | 5/1998 |
| JP | 61-128900 | 8/1986 |
| JP | 7-162997 | 6/1995 |
| JP | 10-200352 | 7/1998 |
| JP | 2000-90221 | 3/2000 |
| JP | 2005-50130 | 2/2005 |
| JP | 2005-328000 | 11/2005 |
| JP | 2006-13133 | 1/2006 |
| JP | 2006-204646 | 8/2006 |

OTHER PUBLICATIONS

English language Abstract of JP 2005-50130, Feb. 24, 2005.
English language Abstract of JP 2000-90221, Mar. 31, 2000.
English language Abstract of JP 61-128900, Aug. 12, 1986.
English language Abstract of JP 7-162997, Jun. 23, 1995.
English language Abstract of JP 2006-13133, Jan. 12, 2006.
English language Abstract of JP 2005-328000, Nov. 24, 2005.

* cited by examiner

*Primary Examiner* — Allan R Wilson
(74) *Attorney, Agent, or Firm* — Greenblum & Bernstein, P.L.C.

(57) ABSTRACT

Supply of power is ensured on use without requiring troublesome works such as battery replacement work and charging work. Specifically, hearing aids, which collect sound, amplify the collected sound, and output the amplified sound, boosts electromotive force generated by the Peltier module derived from temperature difference between a human-body contact portion and an ambient-air contact portion, and causes sound collecting units, a controller IC, a speaker to operate by the boosted voltage.

7 Claims, 10 Drawing Sheets

(a)

(b)

HEARING AID

TECHNICAL FIELD

The present invention relates to a hearing aid that supports auditory function by amplifying and outputting collected sound.

BACKGROUND ART

There have been devised and embodied hearing aids that moderate hearing impairment by amplifying and outputting collected sound. In order to support user's preferences and use conditions, such hearing aids are various in forms, such as a Behind-the-Ear (BTE) type and a Completely-in-Canal (CIC) type, as disclosed, for example, in Japanese Patent Application Laid-Open No. 7-162997. Any of these hearing aids are driven by an internal battery or a rechargeable battery, and therefore no longer work when supply of power is unexpectedly stopped depending on frequency or duration of use, which is a nagging problem in these hearing aids.

These hearing aids driven by such an internal battery prevent the unexpected stop of power supply by providing an advance notice of battery replacement time or charging time. Such battery replacement work or charging work is, however, very troublesome for the hearing aids used on a daily basis.

The present invention has therefore been proposed in view of the foregoing circumstance, and an object thereof is to provide a hearing aid that reliably supplies power when used without requiring troublesome work such as battery replacement work and charging work.

DISCLOSURE OF THE INVENTION

The hearing aid of the present invention solves the aforementioned problems because it comprises: a sound collecting unit that collects sound; an amplifier that amplifies the sound collected by the sound collecting unit; an output unit that outputs the sound amplified by the amplifier; a human-body contact portion that comes into contact with a human body; an ambient-air contact portion that comes into contact with ambient air; a thermoelectric device that generates electromotive force by temperature difference between the human-body contact portion and the ambient-air contact portion; a booster that raises the electromotive force generated by the thermoelectric device; and a controller that causes the sound collecting unit, the amplifier, and the output unit to operate by voltage raised by the booster.

The hearing aid of the present invention solves the aforementioned problems because it further comprises a capacitor that stores excess voltage of the electromotive force generated by the thermoelectric device, which is not necessary to amplify and output the collected sound, and because the controller causes the sound collecting unit, the amplifier, and the output unit to operate by the excess voltage stored in the capacitor in response to a drop in the electromotive force generated by the thermoelectric device.

Moreover, the hearing aid of the present invention solves the aforementioned problems because the booster is formed directly onto a three-dimensional circuit board.

Furthermore, the hearing aid of the present invention solves the aforementioned problems because the capacitor is formed directly onto the three-dimensional circuit board.

BEST MODE FOR CARRYING OUT THE INVENTION

Figure 1:
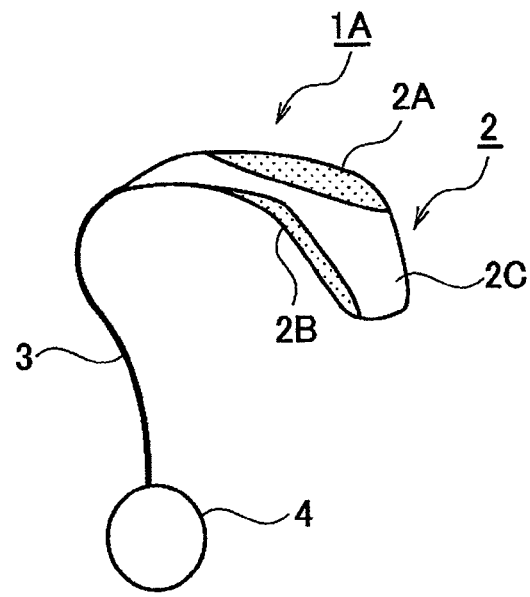
FIG. 1 shows an external appearance of a hearing aid according to a first embodiment of the present invention.
Figure 1:
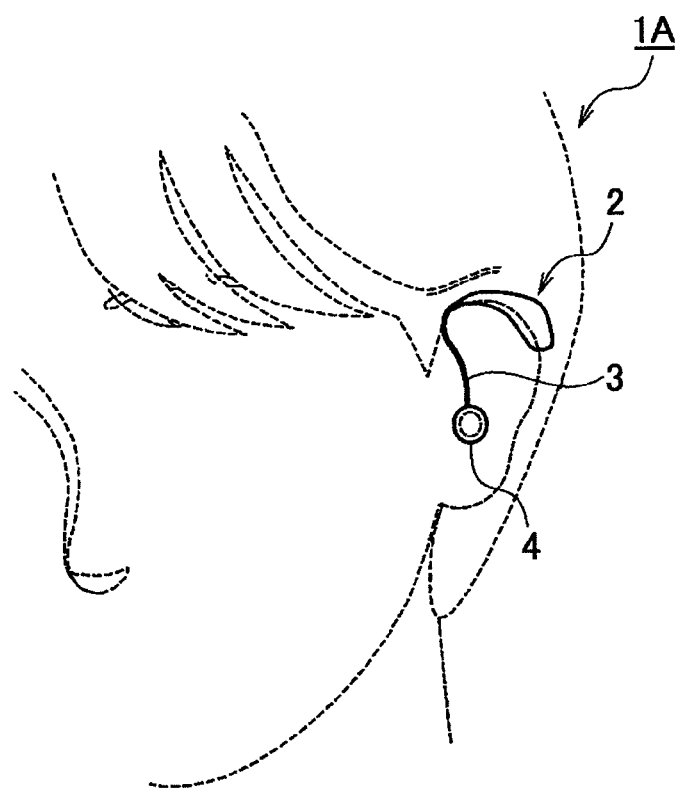

Referring to the drawings, embodiments of the present invention will be described below.

First Embodiment

Referring first to FIG. 1, a hearing aid 1A according to a first embodiment of the present invention will be explained. As shown in FIG. 1(*a*), the hearing aid 1A includes a main unit 2 having incorporated therein a primary circuit of the hearing aid 1A and being shaped to hang on an upper portion of a user's ear, a cable 3 extending from the main unit 2, and an earphone 4 being connected electrically with the cable 3 and amplifying and outputting sound collected by the main unit 2. The hearing aid 1A is used with the main unit 2 hung on the upper portion of the user's ear and with the earphone 4 inserted into an ear hole of the ear, as shown in FIG. 1(*b*).

Referring next to a vertical section of FIG. 1(*a*) shown in FIG. 2 and a block diagram shown in FIG. 3, a configuration of the hearing aid 1A will be explained.

Figure 2:
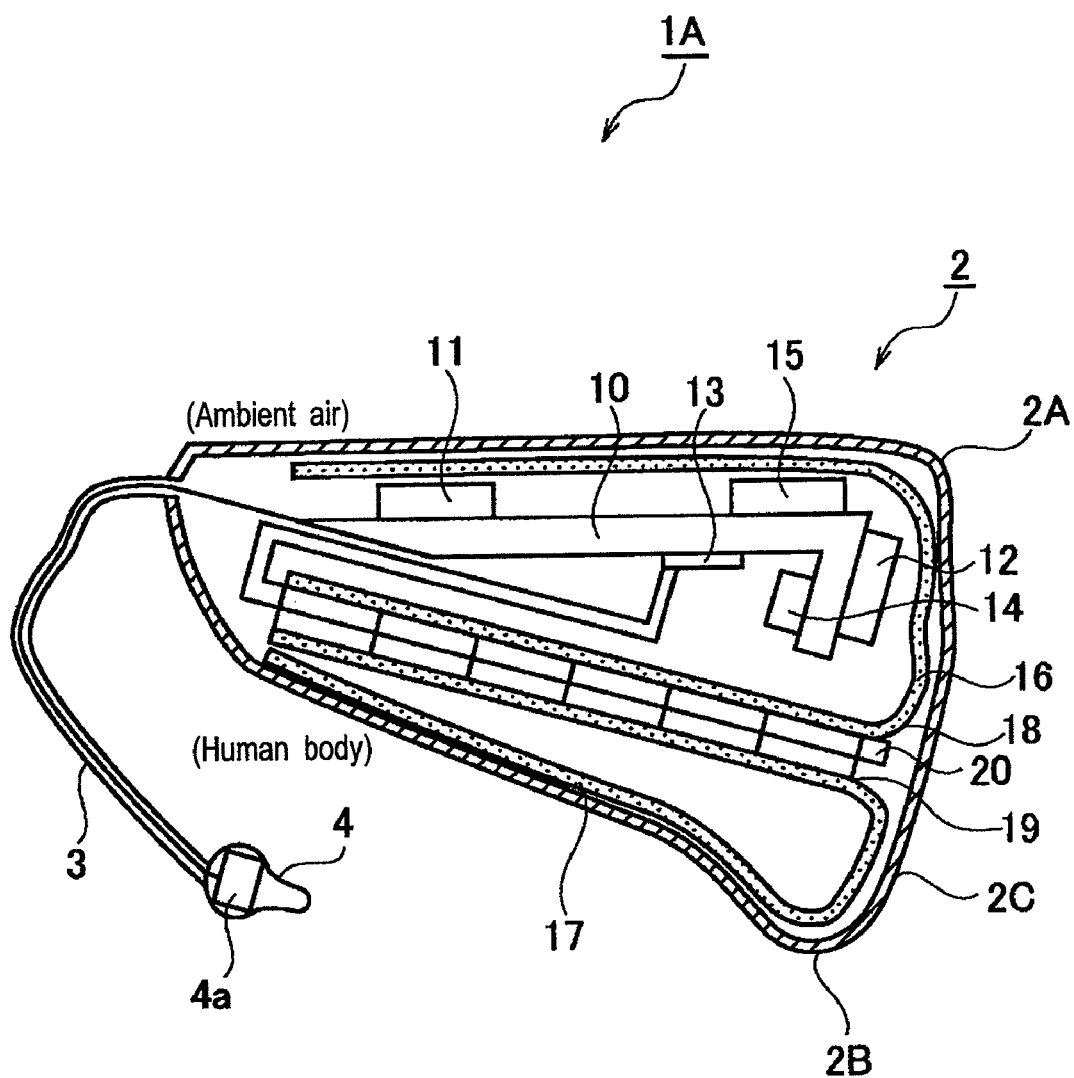
FIG. 2 shows a vertical section of the hearing aid.
Figure 3:
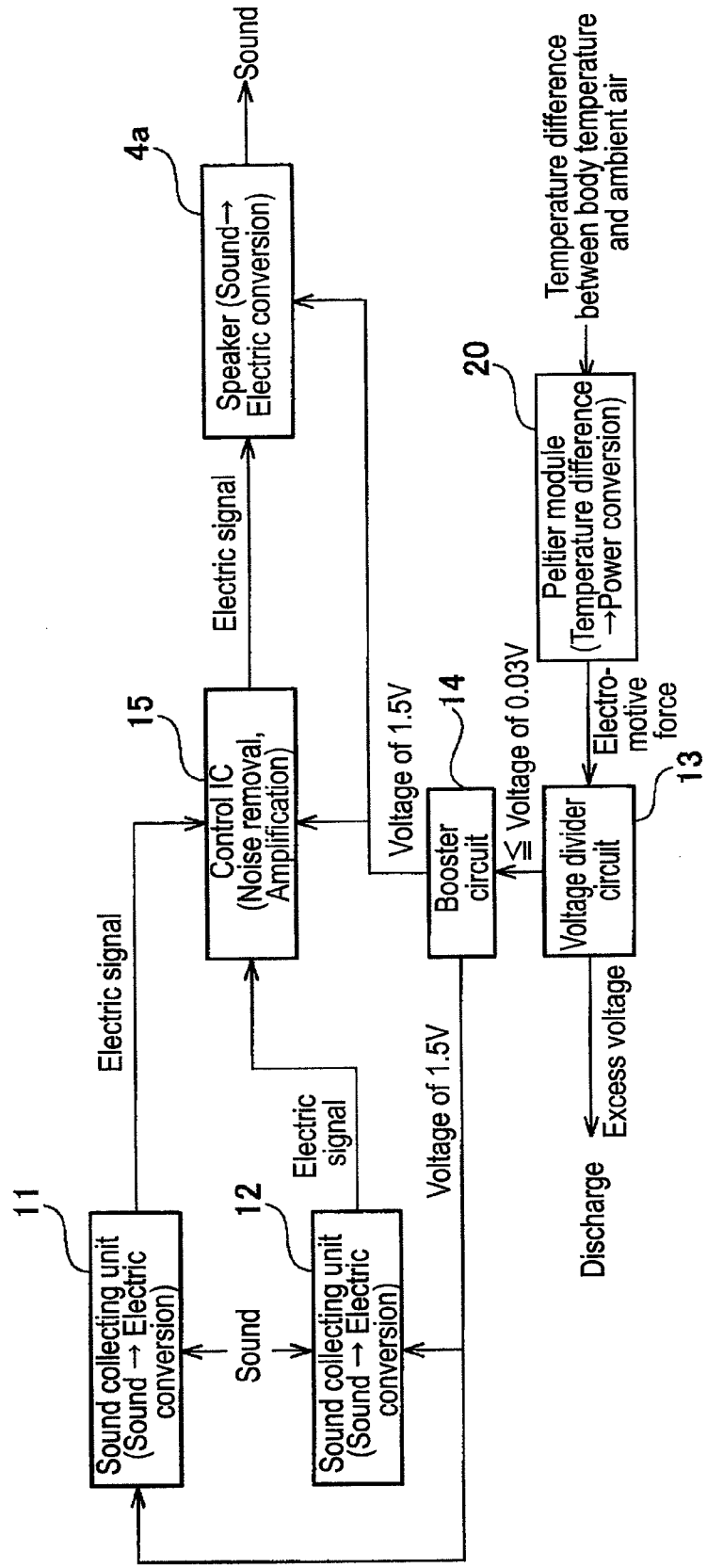
FIG. 3 shows a configuration of the hearing aid.

As shown in FIG. 2, the main unit 2 of the hearing aid 1A includes: a three-dimensional circuit board 10 provided with sound collecting units 11 and 12, a voltage divider circuit 13, a booster circuit 14, and a control IC (Integrated Circuit) 15; a Peltier module 20 that generates thermoelectric force; a thermal conductive carbon-fiber sheet 16 connected via thermal conductive grease 18 to a low temperature side of the Peltier module 20 so as to adhere closely thereto; and a thermal conductive carbon-fiber sheet 17 connected via thermal conductive grease 19 to a high temperature side of the Peltier module 20 so as to adhere closely thereto.

The three-dimensional circuit board 10, which is a board for implementing high-density mounting of electronic components, can easily secure a limited mounting space of the hearing aid 1A.

The sound collecting units 11 and 12 collect external sound, and are, so-called microphones. On the three-dimensional circuit board 10, the sound collecting unit 11 is placed at a desired position where sound coming from ahead and above can be collected, and the sound collecting unit 12 is placed at a desired position where sound coming from behind can be collected, when the main unit 2 is hung on a user's ear. As shown in FIG. 3, the sound collected by the sound collecting units 11 and 12 is converted into electric signals and then output to the control IC 15.

The Peltier module 20 is an thermoelectric device for converting thermal energy directly into electric energy by utilizing thermoelectric generation determined by temperature differences and physical properties of substances based on the Seebeck effect. For example, the Peltier module 20 includes twelve p-type Peltier devices and twelve n-type Peltier devices each of 0.45×0.5 mm size, which are formed out of Bi (Bismuth)-Te (Tellurium)-based materials on a 4 mm×4 mm aluminum nitride substrate, and in an example shown in FIG. 2, six pieces of the Peltier modules 20 are connected in series to ensure sufficient electromotive force.

It should be noted that, when Seebeck coefficients of each p-type Peltier device and each n-type Peltier device is 205 μV/K and −200 μV/K, respectively, a temperature difference of about 2° C. between ambient air and a human body is enough to power each circuit component of the hearing aid 1A.

The voltage divider circuit 13 is an IC that divides the electromotive force generated by the Peltier module 20 (down to, e.g., about 0.03V), outputs the resultant voltage to the booster circuit 14, and controls discharge of excess voltage remaining after the voltage dividing.

The booster circuit 14 raises the electromotive force generated by the Peltier module 20 and then divided by the voltage divider circuit 13. For example, the booster circuit 14 multiplies the divided voltage value of 0.03V output from the voltage divider circuit 13 by 50 (1.5V), and supplies the obtained voltage to each circuit mounted on the three-dimensional circuit board 10 as operating power. The voltage obtained by the booster circuit 14 is supplied also to a speaker 4a provided in the earphone 4 via the cable 3 as operating power.

The control IC 15 controls the entire hearing aid 1A as a whole. For example, the control IC 15 executes tone controls such as noise removal and amplification of the electric signals output from the sound collecting units 11 and 12.

For a housing for the main unit 2, a carbon fiber-filled LCP (Liquid Crystal Polyester) package 2A is used for a portion coming into contact with the ambient air when the hearing aid 1A is hung on the user's ear for use, and also a carbon fiber-filled LCP package 2B is used for a portion coming into contact with the human body. A carbon fiber-filled LCP package 2C is also used for another portion of the housing for the main unit 2 so that electrical insulation is obtained between the carbon fiber-filled LCP packages 2A and 2B. A thickness of the housing for the main unit 2 is about 0.5 mm. The carbon fiber-filled LCP packages 2A and 2B each contain 30% of carbon fiber.

As shown in FIG. 2, the thermal conductive carbon-fiber sheet 16, which is connected via the thermal conductive grease 18 to the low temperature side (upper surface) of the Peltier module 20 so as to adhere closely thereto, is led to be in contact with the carbon fiber-filled LCP package 2A that partially forms the housing for the main unit 2 of the hearing aid 1A. This reliably transmits an ambient temperature from the carbon fiber-filled LCP package 2A that is in contact with the ambient air, to the low temperature side of the Peltier module 20.

The thermal conductive carbon-fiber sheet 17, which is connected via the thermal conductive grease 19 to the high temperature side (lower surface) of the Peltier module 20 so as to adhere closely thereto, is led to be in contact with the carbon fiber-filled LCP package 2B that partially forms the housing for the main unit 2 of the hearing aid 1A. This reliably transmits a user's body temperature from the carbon fiber-filled LCP package 2B that is in contact with the human body, to the high temperature side of the Peltier module 20.

It should be noted that instead of the thermal conductive grease 18 and 19, sheets having high thermal conductivity such as thermal conductive sheets can be used.

Advantages of the First Embodiment

As described above, the hearing aid 1A according to the first embodiment of the present invention transmits the ambient temperature to the low temperature side of the Peltier module 20 via the carbon fiber-filled LCP package 2A that partially forms the housing for the main unit 2, the thermal conductive carbon-fiber sheet 16, and the thermal conductive grease 18, and further transmits the user's body temperature to the high temperature side of the Peltier module 20 via the carbon fiber-filled LCP package 2B that partially forms the housing for the main unit 2, the thermal conductive carbon-fiber sheet 17, and the thermal conductive grease 19.

As a result, the Peltier module 20 generates the electromotive force derived from the temperature difference between the ambient air and the human body by the Seebeck effect, and a portion of the generated electromotive force is then raised to a desired voltage by the booster circuit 14, so that each circuit on the three-dimensional circuit board 10, which is essential to operate the hearing aid 1A, and the speaker 4a in the earphone 4 can be reliably powered without requiring troublesome works such as battery replacement and charging.

Second Embodiment

Figure 4:
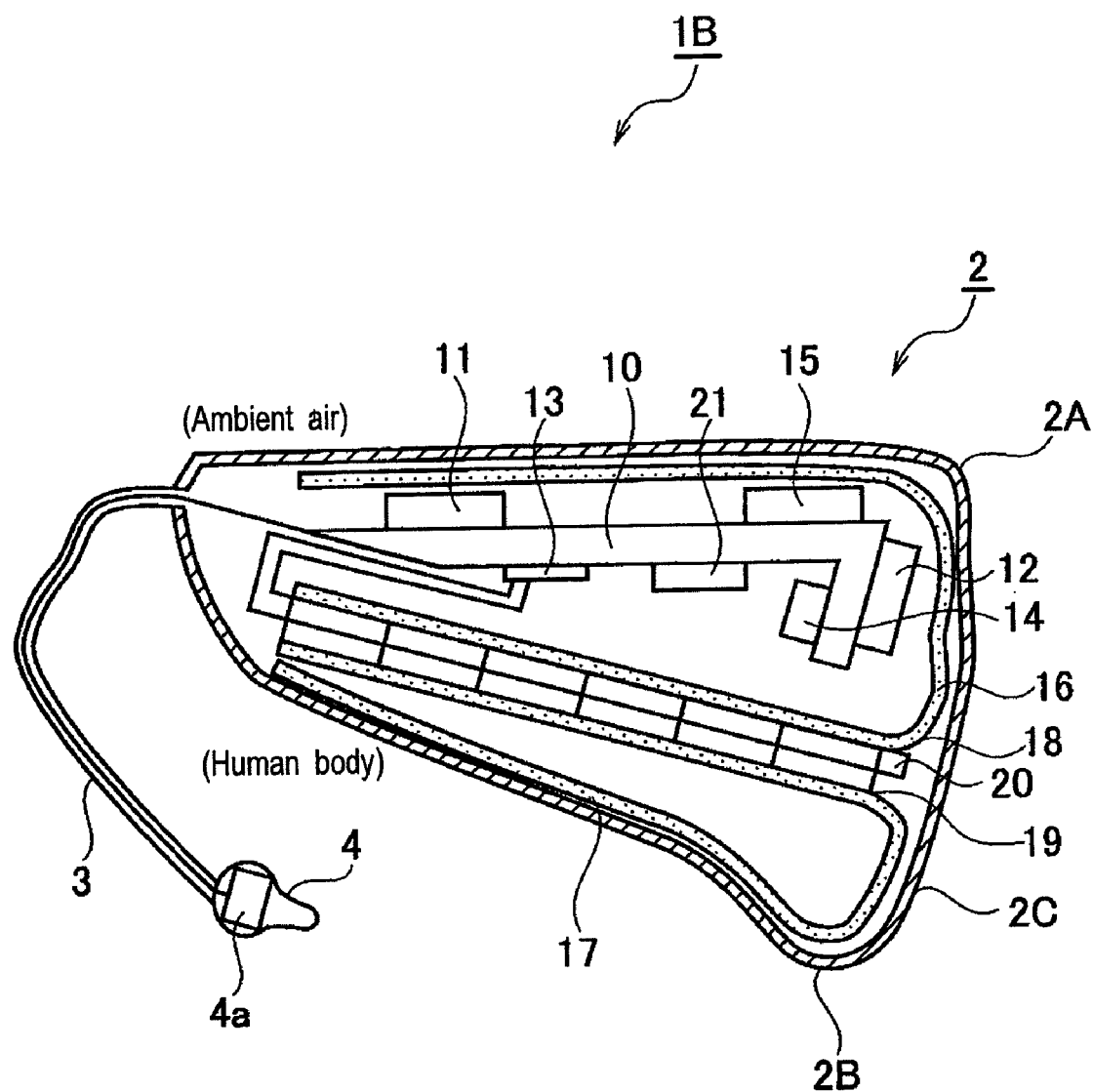
FIG. 4 shows a vertical section of a hearing aid according to a second embodiment of the present invention.
Figure 5:
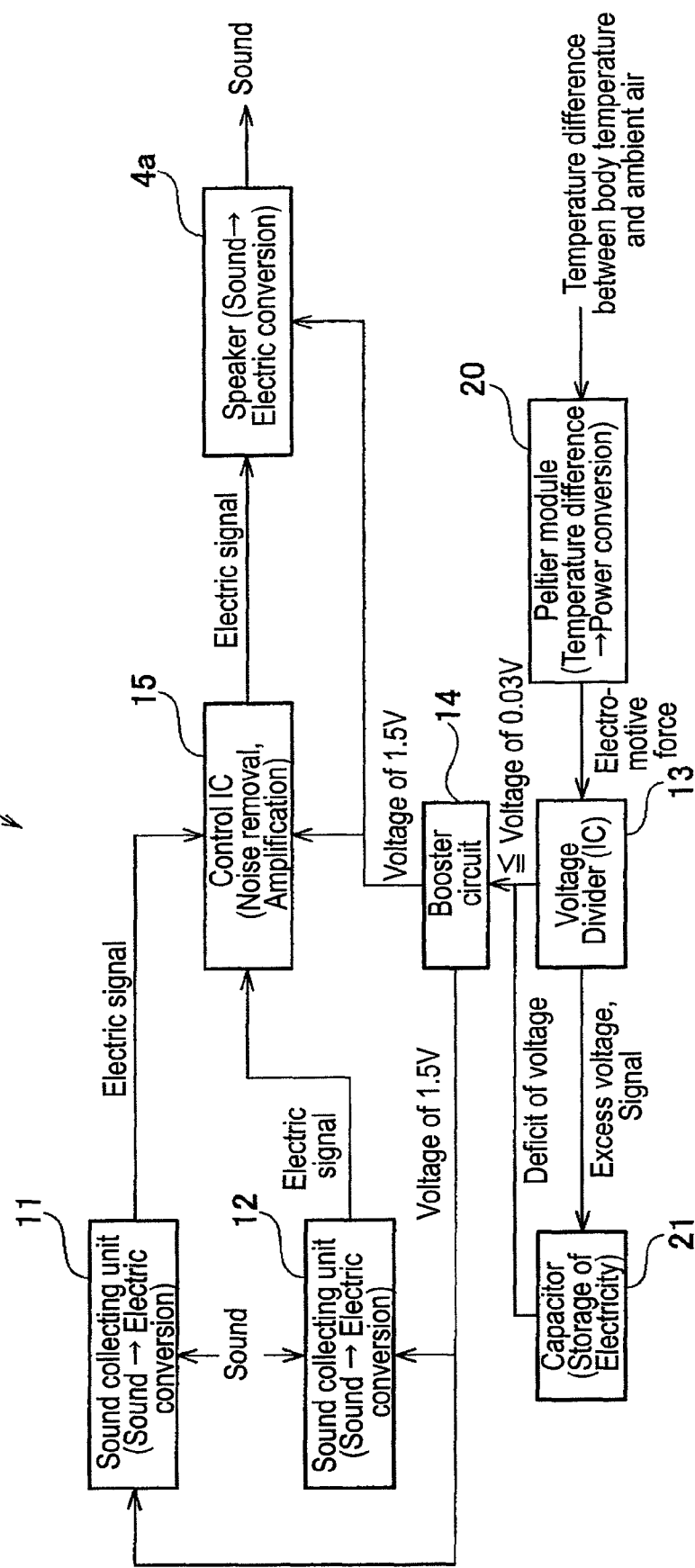
FIG. 5 shows a configuration of the hearing aid.

Referring next to FIGS. 4 and 5, a hearing aid 1B according to a second embodiment of the present invention will be explained. An appearance of the hearing aid 1B is absolutely the same as that of the hearing aid 1A shown in FIGS. 1(a) and 1(b), so explanations thereof will be omitted. Also, as shown in FIG. 4, only a capacitor 21 is added to the components of the hearing aid 1A according to the first embodiment, so like reference numerals refer to like parts and explanations thereof will also be omitted.

In the aforementioned hearing aid 1A according to the first embodiment of the present invention, the voltage divider circuit 13 outputs only a required voltage to the booster circuit 14, while in the hearing aid 1B, the capacitor 21 stores excess voltage. In the case that the electromotive force voltage obtained from the Peltier module 20 drops (e.g., below 0.03V) to cause insufficient supply of power even when raised by the booster circuit 14, the voltage divider circuit 13 reads the voltage stored in the capacitor 21 as a deficit of voltage, and then outputs the read voltage to the booster circuit 14.

According to the hearing aid 1B in the second embodiment, when the Seebeck coefficients of each p-type Peltier device and each n-type Peltier device is 205 μV/K and −200 μV/K, respectively, a temperature difference of about 2° C. between the ambient air and the human body is enough to power each circuit component of the hearing aid 1A, as in the case of the hearing aid 1A described earlier. Furthermore, after the hearing aid 1B has been used for 3 hours under a condition of a temperature difference of 3° C. between the ambient air and the human body thereby to store the excess voltage in the capacitor 21, the hearing aid 1B can operate for about 1 hour under an environment of a temperature difference of only 1° C. between the ambient air and the human body.

Advantages of the Second Embodiment

As described above, the hearing aid 1B according to the second embodiment of the present invention causes the capacitor 21 to store the excess voltage of the electromotive force generated by the Peltier module 20 since the excess voltage is not supplied to the booster circuit 14.

Accordingly, when sufficient voltage cannot be supplied to the booster circuit 14 due to a drop in the electromotive force generated by the Peltier module 20, the voltage stored in the capacitor 21 is utilized for more stable power supply.

Third Embodiment

Figure 6:
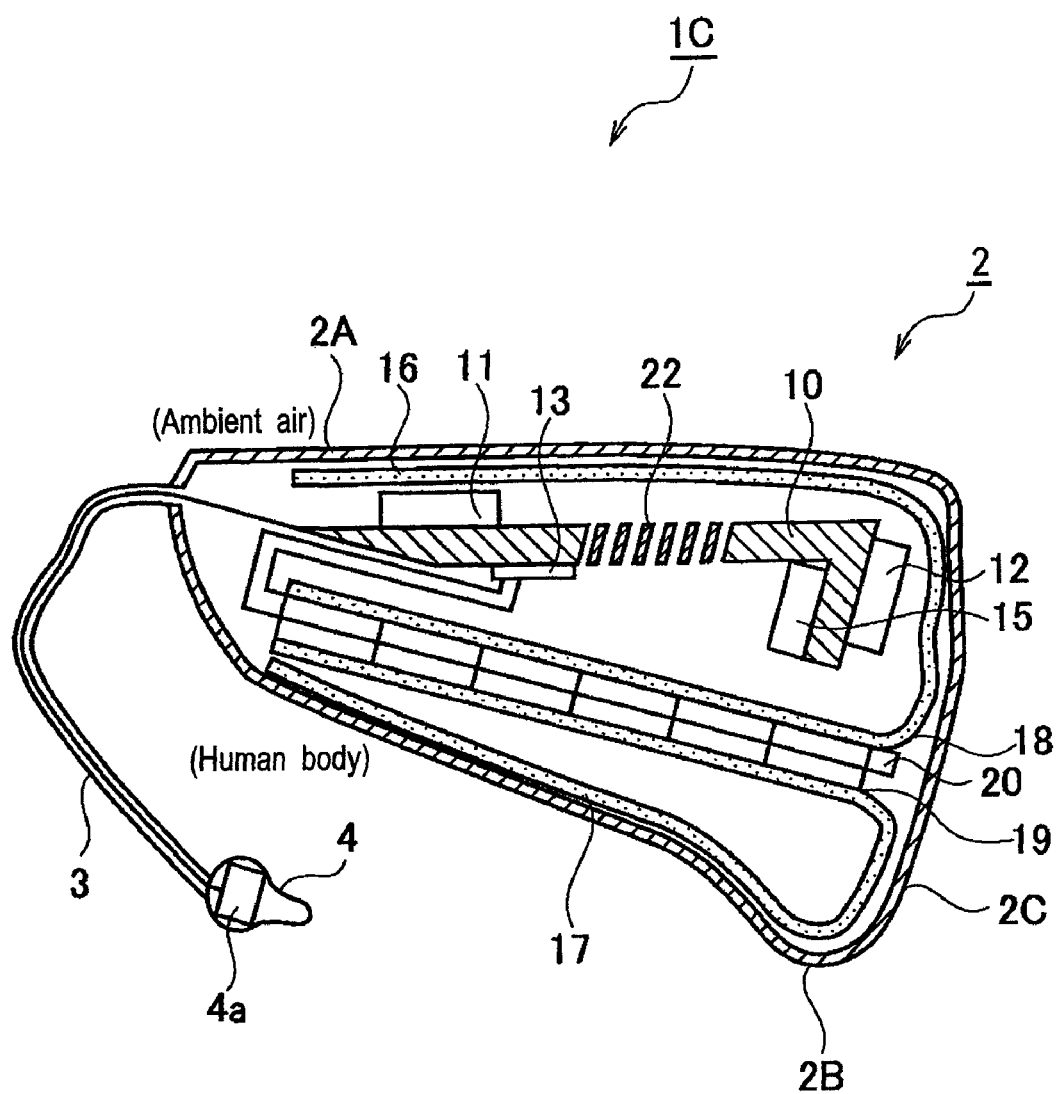
FIG. 6 shows a vertical section of a hearing aid according to a third embodiment of the present invention.
Figure 7:
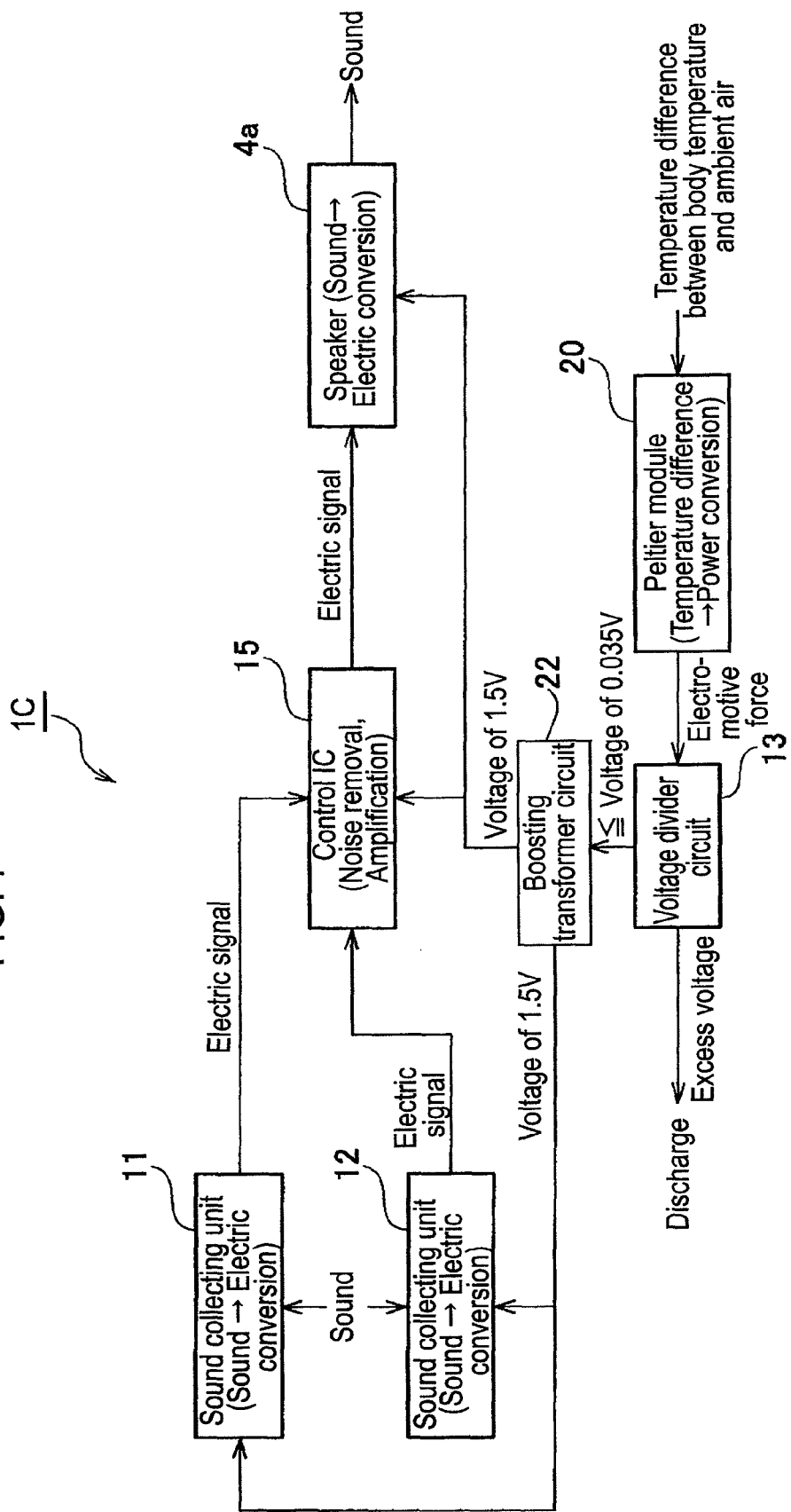
FIG. 7 shows a configuration of the hearing aid.

Referring next to FIGS. 6 and 7, a hearing aid 1C according to a third embodiment of the present invention will be explained. An appearance of the hearing aid 1C is absolutely the same as that of the hearing aid 1A shown in FIGS. 1(a) and 1(b), so explanations thereof will be omitted. Also, as shown in FIG. 6, only a boosting transformer circuit 22 is added instead of the booster circuit 14 of the hearing aid 1A according to the first embodiment, so like reference numerals refer to like parts and explanations thereof will also be omitted.

The voltage divider circuit 13 is an IC that divides the electromotive force generated by the Peltier module 20 (down to, e.g., about 0.035V), outputs the obtained voltage to the boosting transformer circuit 22, and controls discharge of the excess voltage remaining after the voltage dividing.

Figure 8:
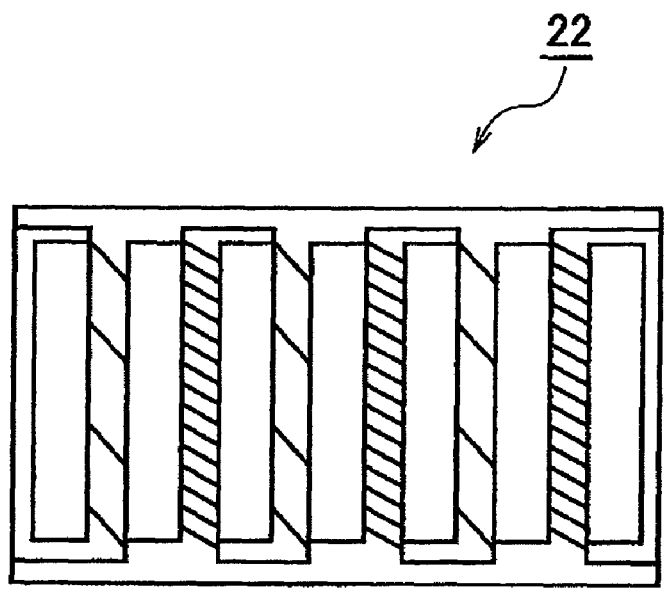
FIG. 8 schematically shows a boosting transformer circuit of the hearing aid.

As shown in FIG. 6, the boosting transformer circuit 22 is coiled around the three-dimensional circuit board 10, and raises the electromotive force generated by the Peltier module 20 and then divided by the voltage divider circuit 13. FIG. 8 schematically shows the boosting transformer circuit 22. As shown in FIG. 8, the boosting transformer circuit 22 is composed of three stages, at each of which voltage boost to 3.5 times higher is achieved. For example, the boosting transformer circuit 22 multiplies the divided voltage value of 0.035V output from the voltage divider circuit 13 by 3.5×3.5× 3.5 times (about 1.5V), and supplies the obtained voltage to each circuit mounted on the three-dimensional circuit board 10 as operating power. The voltage obtained by the boosting transformer circuit 22 is supplied also to the speaker 4a provided in the earphone 4 via the cable 3 as operating power.

According to the hearing aid 1C in the third embodiment of the present invention, when the Seebeck coefficients of each p-type Peltier device and each n-type Peltier device is 205 μV/K and −200 μV/K, respectively, a temperature difference of about 2.5° C. between the ambient air and the human body is enough to power each circuit component of the hearing aid 1C, as in the case of the hearing aid 1A described earlier.

Advantages of the Third Embodiment

As described above, the Peltier module 20 of the hearing aid 1C according to the third embodiment of the present invention generates the electromotive force derived from the temperature difference between the ambient air and the human body by the Seebeck effect, and a portion of the generated electromotive force is then raised to a desired voltage by the boosting transformer circuit 22, so that each circuit on the three-dimensional circuit board 10, which is essential to operate the hearing aid 1C, and the speaker 4a in the earphone 4 can be reliably powered without requiring troublesome works such as battery replacement and charging.

Furthermore, since the boosting transformer circuit 22 is incorporated into the three-dimensional circuit board 10, the limited mounting space in the main unit 2 can be effectively used, so that the hearing aid 1C can be downsized.

Fourth Embodiment

Figure 9:
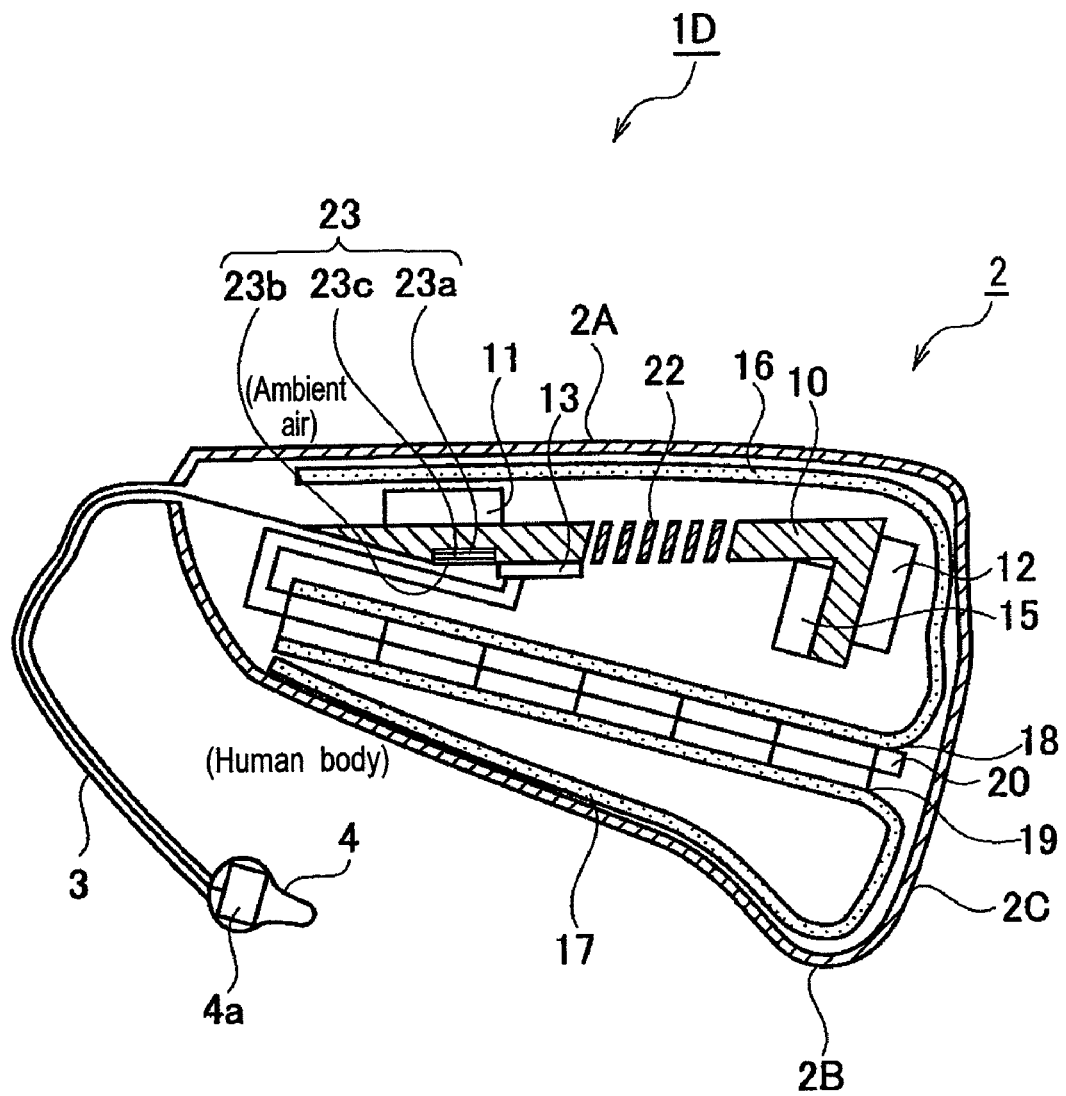
FIG. 9 shows a vertical section of a hearing aid according to a fourth embodiment of the present invention.
Figure 10:
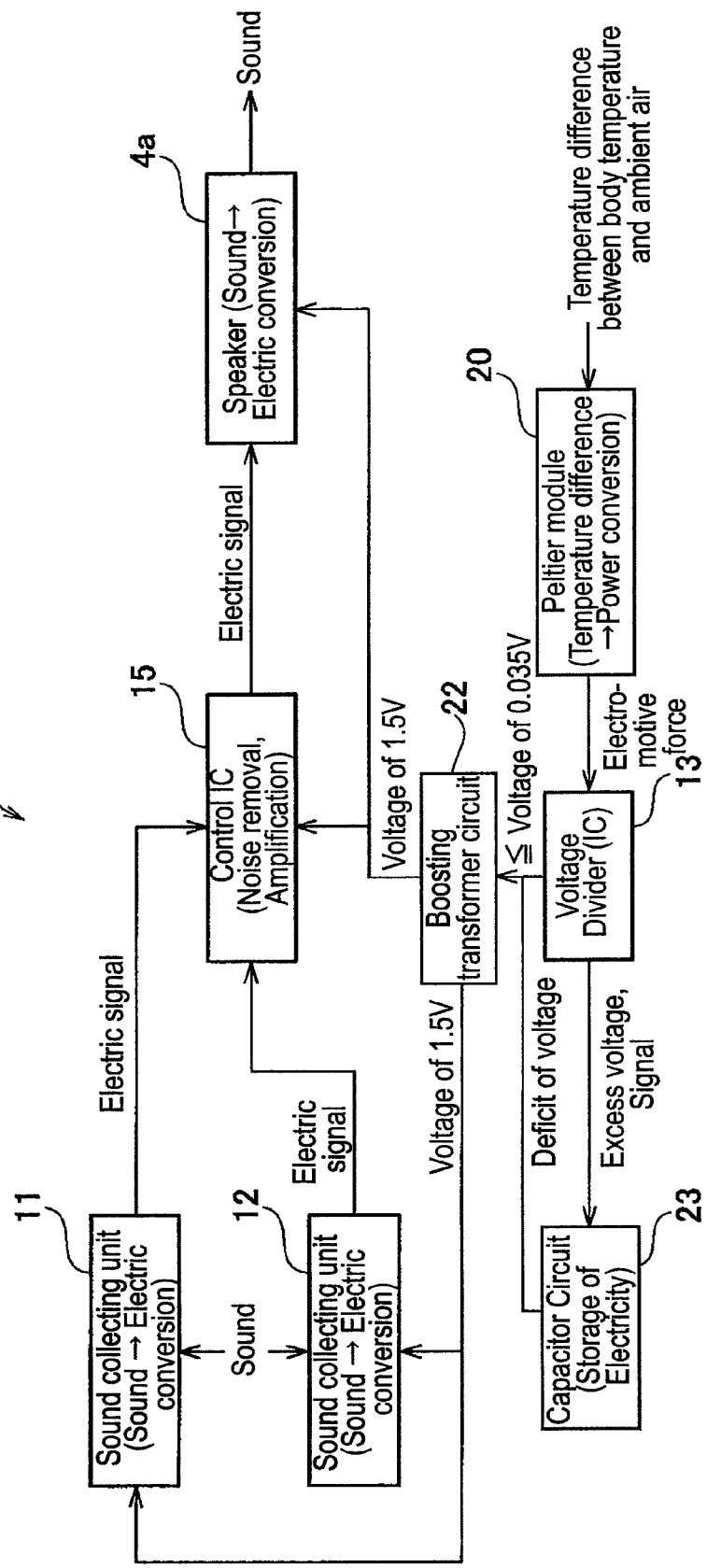
FIG. 10 shows a configuration of the hearing aid.

Referring further to FIGS. 9 and 10, a hearing aid 1D according to a fourth embodiment of the present invention will be explained. An appearance of the hearing aid 1D is absolutely the same as that of the hearing aid 1A shown in FIGS. 1(a) and 1(b), so explanations thereof will be omitted. Also, as shown in FIG. 9, only a capacitor circuit 23 is added to the components of the hearing aid 1C according to the third embodiment, so like reference numerals refer to like parts and explanations thereof will also be omitted.

In the aforementioned hearing aid 1C according to the third embodiment of the present invention, the voltage divider circuit 13 outputs only a required voltage to the boosting transformer circuit 22, while in the hearing aid 1D, the capacitor circuit 23 stores the excess voltage.

The capacitor circuit 23 is composed of electrode films 23a and 23b, and a dielectric film 23c held therebetween. Specifically, the electrode film 23a having a predetermined area is formed in place by copper-plating on the three-dimensional circuit substrate 10, and on this electrode film 23a, the dielectric film 23c is screen-printed and solidified. Subsequently, a circuit is laid out by wiring on the three-dimensional circuit board 10, followed by the formation of the electrode film 23b by copper-plating on the dielectric film 23, thereby to complete the capacitor circuit 23 on the three-dimensional circuit board 10.

In the case that the electromotive force voltage obtained from the Peltier module 20 drops (e.g., below 0.035V) to cause insufficient supply of power even when raised by the boosting transformer circuit 22, the voltage divider circuit 13 reads the voltage stored in the capacitor circuit 23 as a deficit of voltage, and then outputs the read voltage to the boosting transformer circuit 22.

According to the hearing aid 1D in the fourth embodiment of the present invention, when the Seebeck coefficients of each p-type Peltier device and each n-type Peltier device is 205 μV/K and −200 μV/K, respectively, a temperature difference of about 2.5° C. between the ambient air and the human body is enough to power each circuit component of the hearing aid 1D, as in the case of the hearing aid 1C described earlier. Furthermore, after the hearing aid 1D has been used for 3 hours under a condition of a temperature difference of 3° C. between the ambient air and the human body thereby to store the excess voltage in the capacitor circuit 23, the hearing aid 1D can operate for about 2 hour under an environment of a temperature difference of only 2° C. between the ambient air and the human body.

Advantages of the Fourth Embodiment

As described above, the hearing aid 1D according to the fourth embodiment of the present invention causes the capacitor circuit 23 to store the excess voltage of the electromotive force generated by the Peltier module 20 since the excess voltage is not supplied to the boosting transformer circuit 22.

Accordingly, when sufficient voltage cannot be supplied to the boosting transformer circuit 22 due to a drop in the electromotive force generated by the Peltier module 20, the voltage stored in the capacitor circuit 23 is utilized for more stable power supply.

Furthermore, because so-called thin-film technology is used to form the capacitor circuit 23 on the three-dimensional circuit board 10, the limited mounting space in the main unit 2 can be effectively utilized, so that the hearing aid 1D can be downsized.

It should be understood that the foregoing embodiments are examples of the present invention. Therefore, the present invention is not limited thereto, and various changes and modifications in design may be made within other embodiments without departing from the technical spirit of the present invention.

INDUSTRIAL APPLICABILITY

According to the present invention, when a hearing aid is used, the supply of power is ensured without requiring troublesome works such as battery replacement and charging.

Furthermore, according to the present invention, when sufficient voltage cannot be supplied to a booster due to a drop in electromotive force generated by a thermoelectric device, voltage stored in a capacitor is utilized for more stable power supply.

Moreover, according to the present invention, the booster is formed and incorporated directly to a three-dimensional circuit board, so that a limited mounting space of the hearing aid can be effectively utilized, and hence the hearing aid can be downsized.

Furthermore, according to the present invention, the capacitor is formed directly onto the three-dimensional circuit board, the limited mounting space of the hearing aid can be effectively utilized, and hence the hearing aid can be downsized.

The invention claimed is:

1. A hearing aid comprising:
   a sound collecting unit that collects sound;
   an amplifier that amplifies the sound collected by the sound collecting unit;
   an output unit that outputs the sound amplified by the amplifier;
   a human-body contact portion that comes into contact with a human body when the hearing aid is hung on an ear to be used;
   an ambient-air contact portion that comes into contact with ambient air when the hearing aid is hung on an ear to be used;
   a thermoelectric device that generates electromotive force by temperature difference between the human-body contact portion and the ambient-air contact portion;
   a booster that boosts the electromotive force generated by the thermoelectric device;
   a controller that causes the sound collecting unit, the amplifier, and the output unit to operate by voltage boosted by the booster;
   a first thermal conductive sheet that conducts temperature of the human-body contact portion that comes into contact with human-body to high temperature side of the thermoelectric device; and
   a second thermal conductive sheet that conducts temperature of the ambient-air contact portion that comes into contact with ambient air to low temperature side of the thermoelectric device.

2. The hearing aid according to claim 1, further comprising:
   a capacitor that stores excess voltage of the electromotive force generated by the thermoelectric device, which is not necessary to amplify and output the collected sound; wherein
   the controller causes the sound collecting unit, the amplifier, and the output unit to operate by the excess voltage stored in the capacitor in response to a drop in the electromotive force generated by the thermoelectric device.

3. The hearing aid according to claim 1, wherein the booster is formed directly on a three-dimensional circuit board.

4. The hearing aid according to claim 2, wherein the capacitor is formed directly on the three-dimensional circuit board.

5. The hearing aid according to claim 2, wherein the booster is formed directly on a three-dimensional circuit board.

6. The hearing aid according to claim 3, wherein the capacitor is formed directly on the three-dimensional circuit board.

7. The hearing aid according to claim 5, wherein the capacitor is formed directly on the three-dimensional circuit board.

* * * * *